(12) United States Patent
Belleville et al.

(10) Patent No.: US 6,558,998 B2
(45) Date of Patent: May 6, 2003

(54) SOI TYPE INTEGRATED CIRCUIT WITH A DECOUPLING CAPACITY AND PROCESS FOR EMBODIMENT OF SUCH A CIRCUIT

(76) Inventors: Marc Belleville, 4 bis rue du Cotaire, St. Egreve (FR), F-38120; Michel Bruel, Presvert n 9, Veurey (FR), F-38113

( * ) Notice: Subject to any disclaimer, the term of this patent is extended or adjusted under 35 U.S.C. 154(b) by 0 days.

(21) Appl. No.: 10/075,382

(22) Filed: Feb. 15, 2002

(65) Prior Publication Data

US 2002/0094629 A1 Jul. 18, 2002

Related U.S. Application Data

(62) Division of application No. 09/750,841, filed as application No. PCT/FR99/01403 on Jun. 14, 1999.

(30) Foreign Application Priority Data

Jun. 15, 1998 (FR) .............................. 98 07495

(51) Int. Cl.[7] .......................................... H01L 21/8238
(52) U.S. Cl. ...................... 438/210; 438/149; 438/239; 438/244; 438/387
(58) Field of Search ............................... 438/149, 152, 438/200, 210, 238, 239, 244, 253, 387; 257/508, 532

(56) References Cited

U.S. PATENT DOCUMENTS

| | | | | |
|---|---|---|---|---|
| 5,378,919 A | * | 1/1995 | Ochiai | 257/204 |
| 5,828,106 A | * | 10/1998 | Sato | 257/350 |
| 5,939,755 A | * | 8/1999 | Takeuchi et al. | 257/347 |
| 6,147,857 A | * | 11/2000 | Worley et al. | 361/301.2 |

FOREIGN PATENT DOCUMENTS

| | | |
|---|---|---|
| DE | 44 41 724 A1 | 5/1996 |
| EP | 0 694 977 A2 | 1/1996 |

OTHER PUBLICATIONS

Wang, et al., "On–Chip Decoupling Capacitor Design To Reduce Switching–Noise–Induced Instability In CMOS/SOI VLSI", Proceedings 1995 IEEE International SOI Conference, pp. 100–101 (1995).

Wang, et al., "Simultaneous Switching Noise Projection For High–Performance SOI Chip Design", Proceedings 1996 IEEE International SOI Conference, pp. 112–113 (1996).

Silberman, et al., "A 1.0GHz Single–Issue 64b PowerPC Integer Processor", 1998 IEEE International Solid–State Circuits Conference, pp. 230–231 (1998).

* cited by examiner

Primary Examiner—Eddie Lee
Assistant Examiner—N. Drew Richards
(74) Attorney, Agent, or Firm—Thelen Reid & Priest LLP; Robert E. Krebs

(57) ABSTRACT

Integrated circuit comprising:
  at least one first and one second power supply terminal (418, 420),
  at least one active area (302, 304, 306, 308) formed in a thin layer (206) of a substrate and electrically connected to at least one of the power supply terminals.

According to the invention, the circuit also comprises capacitive decoupling means formed by at least one dielectric capacitor (110, 112, 114) connected between the said, first and second power supply terminals and formed in a region of the substrate that is electrically insulated from the thin substrate layer (206).

Applications include the manufacture of portable electronic equipment.

4 Claims, 3 Drawing Sheets

SOI TYPE INTEGRATED CIRCUIT WITH A DECOUPLING CAPACITY AND PROCESS FOR EMBODIMENT OF SUCH A CIRCUIT

This application is a divisional of U.S. application No. 09/700,841, filed on Dec. 18, 2001, which was a national stage filing under 35 U.S.C. § 371 of International Application No. PCT/FR99/01403 filed on Jun. 14, 1999, which International Application was not published by the International Bureau in English.

TECHNICAL FIELD

The invention relates to an integrated circuit structure comprising capacitive means of decoupling power supply terminals from the circuit.

It is used for applications in the fields of micro-electronics for making circuits with MOS, MIS or bipolar components, and to reduce parasite noise generated on electrical power supplies for circuits caused particularly by transient current demand.

More precisely, the invention may be used in, portable appliances for example such as microprocessors, cordless telephony circuits or any other applications using SOI technologies for their low consumption characteristics.

STATE OF PRIOR ART

In integrated circuits, the distribution of grounds and power supply potentials to active devices, in other words for example to transistors, is achieved by using power supply tracks made of an electrically conducting material. During operation of the circuits, the power supply tracks must output transient currents with a relatively high intensity.

These transient currents can generate parasite noise on tracks and the power supply system, depending on their intensity and location.

Filtering capacitors are usually used in electronic circuits connected between the terminals of power supply systems to reduce parasite noise, and are placed as close as possible to the transient current source.

In the field of integrated electronics, the manufacture of filtering capacitors can cause problems. However, the structure of some types of integrated circuits such as CMOS (Complementary Metal Oxide Semiconductor) circuits on solid substrates can naturally decouple power supply potentials and the ground potential.

FIG. 1 is a diagrammatic view through part of a typical CMOS type of integrated circuit.

In this figure, reference 10 denotes a solid silicon substrate with a P type of conductivity. An N type caisson 12 is formed in this substrate. References 14 and 16 denote field effect transistors made in the P type substrate and in the N type caisson respectively.

Strongly doped active areas 14a, 14b, 16a, 16b, 18 and 20 form sources and drains of field effect transistors 14, 16, and contact areas for the P and N type regions, respectively.

The P+ type active area 18 is in contact with the P type substrate and the N+ type active area 20 is in contact with the N type caisson.

A thick electrical insulating layer 22 covers the substrate and components 14, 16 that are made on it. Openings 24 pass through this layer, and an electrically conducting material is stacked on it in order to connect the active areas to conducting tracks 26, 28, 30 formed above the electrical insulating layer 22. The openings filled with an electrical conducting material are also called "vias".

The vias connect active areas to each other. For example, this is the case of vias connected to the central conducting track 26 that electrically connect the active areas 14b and 16a to each other. The vias also connect active areas and/or regions of the substrate to power supply terminals.

In FIG. 1, the power supply terminals consist of conducting tracks 28 and 30 that are connected to a power supply source 31 diagrammatically shown as continuous lines.

The conducting track 28 forms a ground terminal. It is connected to the active area 14a of the first transistor 14, and to the substrate 10 through the active area 18. A second power supply terminal formed by the conducting track 30 is connected particularly to caisson 12 through the active area 20.

The caisson 12 forms a semi-conducting junction with the substrate 10 which has a certain junction capacity and which is connected between the power supply terminals 28, 30 in parallel with the components.

Thus the capacitance of the caisson-substrate junction filters the power supply and reduces parasite noise due to current demand.

There are other types of CMOS structures with N caissons, P caissons or double caissons. Junction capacitors formed between the caissons and the substrate are usually sufficient to obtain intrinsic decoupling between the ground terminal and the other power supply terminals.

However, a number of integrated circuits made at the present time are not formed on a solid substrate as mentioned above, but are formed in a thin layer of a support with a Silicon On Insulator type structure. This type of structure, usually denoted "SOI", comprises an electrically insulating material, for example oxide, that separates the thin layer of silicon from a solid part of the support. Making integrated circuits on SOI type substrates can increase the integration density, reduce parasite capacitances and improve performances of circuits in terms of operating frequency and consumption.

In the case of circuits made on SOI substrates, the insulation between the different components or active areas is formed by oxide areas.

Thus, decoupling between grounds and other power supply terminals through the substrate in structures on a solid substrate is much weaker in circuits made on SOI type substrates.

Therefore, higher noise is observed in these circuits. For example, this problem is described in document (1), for which the reference is given at the end of this description.

One possible solution for reducing parasite noise consists of adding decoupling capacitors to the integrated circuit formed in the thin layer of the SOI structure. These capacitors may be made using the grid capacitor of one or several transistors. For example, an NMOS type transistor can be used in which the grid is connected to a power supply terminal and in which the source and drain are connected to the ground. A better quality capacitance can be achieved by using an appropriate layout of the channel in such a transistor.

However, transistors or other capacitors dedicated to decoupling power supply terminals are placed on the SOI structure adjacent to transistors forming the functional part of the integrated circuit. Thus, they occupy useful space thus increasing the total area of electronic chips.

Further information on this subject can be found in documents (2) and (3), for which the references are given at the end of the description.

Technological background of the invention is also illustrated in document (4).

PRESENTATION OF THE INVENTION

The purpose of this invention is to propose an integrated circuit formed in a thin insulated layer of a substrate, for example such as a thin layer of an SOI substrate which does not have the limitations mentioned above.

One particular purpose is to propose a circuit including means of decoupling the terminals of one or several power supplies in order to efficiently reduce the parasite noise in power supplies.

Another purpose is to propose such a circuit using a chip with a small surface area.

In order to achieve these objectives, the purpose of the invention is an integrated circuit comprising:
- at least one first and one second power supply terminal,
- at least one active area formed in a thin layer of a substrate and electrically connected to at least one of the power supply terminals.

According to the invention, the integrated circuit also comprises capacitive decoupling means formed by at least one dielectric capacitor connected between the said first and second power supply terminals and formed in a region of the substrate that is electrically insulated from the thin substrate layer.

For the purposes of this invention, an active area is an area of the thin layer with a determined type of doping. An electronic circuit can include a very large number of active areas that in particular can form parts of transistors such as transistor sources or drains.

Furthermore, power may be supplied to the circuit by one or several power supplies. A power supply terminal is a conducting element connected to a power supply, the potential of which is fixed by the said power supply. The ground terminal is one particular power supply terminal.

With the invention, the capacitive decoupling means do not reduce the available space for functional components of the integrated circuit, in other words for the active areas, since they are not formed in the thin layer.

According to one particular advantageous aspect, the region comprising capacitive decoupling means may extend at least partly below the active area(s) of the integrated circuit.

This characteristic makes an even greater contribution to reducing the total area of the chip used in the circuit.

The capacitive decoupling means in the invention may comprise one or several dielectric capacitors. A dielectric capacitor is a capacitor made in the same way as a conventional capacitor, in other words with two foils made of an electrically conducting material separated by an electrically insulating material.

Thus, the substrate region insulated from the thin layer may comprise at least a first and at least a second layer of an electrically conducting material electrically insulated from each other, with at least one surface facing the other and connected to the first and second power supply terminals respectively.

The first and second layers of conducting material, for example made of doped silicon or polycrystalline silicon, may be separated by a silicon oxide layer.

According to one improvement of the invention, the capacitive decoupling means may comprise at least one electrically conducting layer forming a foil of the capacitor, and connected to at least one active area to connect the said active area to a power supply terminal.

The use of decoupling means to distribute an electrical power supply to active areas is not only very useful to even further reduce parasite noise, but also to release a large area to make interconnection tracks for active parts and for signal transport. These tracks are usually-formed on one side of the thin layer opposite the solid part of the SOI substrate.

The invention also relates to a process for making an integrated circuit equipped with capacitive dielectric means. This process comprises the following steps in sequence:
a) formation of a first insulating layer and a second conducting layer in order, starting from the surface, on a substrate comprising a first conducting layer,
b) formation of the second conducting layer to leave at least part of the second conducting layer separated from the first conducting layer by the first insulating layer,
c) formation of a second insulating layer surrounding part of the second conducting layer,
d) creation of a thin layer of semiconducting material on the second insulating layer,
e) formation of at least one component in the thin layer, comprising at least one active area and oxidation of the thin layer between the components,
f) formation of a thick electrical insulating layer on the thin layer,
g) formation of openings passing through the thick insulating layer, the thin layer, and the layer of electrical insulating material outside components to reach the first and second conducting layers,
h) placement of the conducting material in the openings, and formation of electrical interconnections to connect the first and second conducting layers to first and second electrical power supply terminals, respectively.

Step g) can also comprise the formation . of openings passing through the thick insulating layer to reach active areas in the thin layer, these openings also being filled with electrical conducting material to selectively connect active areas to each other or to connect active areas to electrical power supply terminals.

Other characteristics and advantages of this invention will become clearer from the following description with reference to the figures in the attached drawings. This description is given for illustrative purposes only and is in no way restrictive.

DETAILED DESCRIPTION OF EMBODIMENTS OF THE INVENTION

Figure 1:
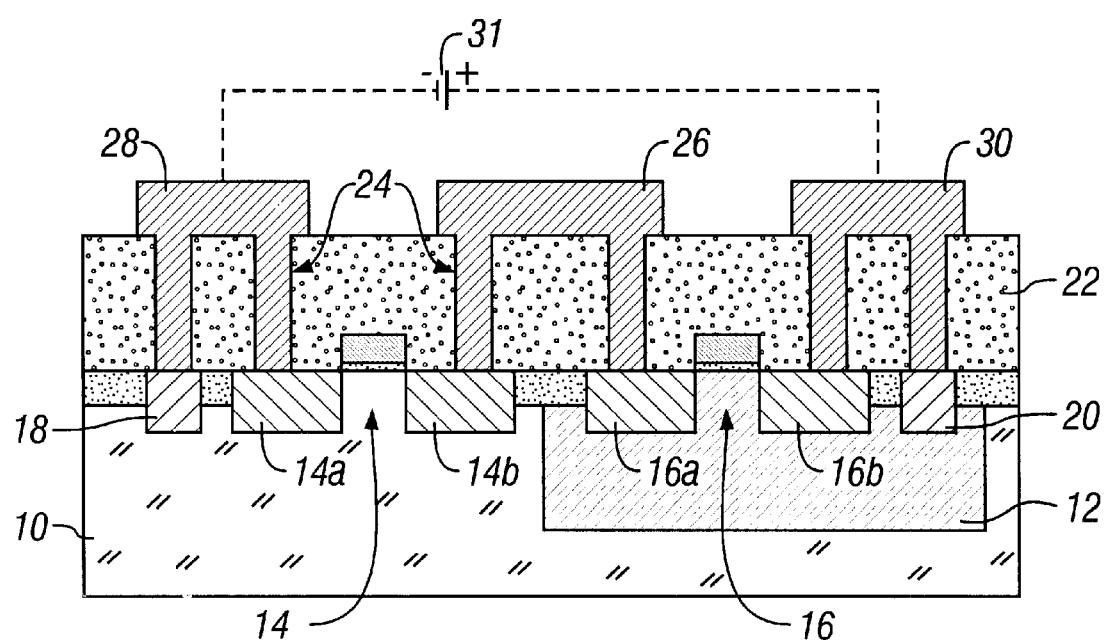
FIG. 1 described above is a diagrammatic section through part of a CMOS integrated circuit of a known type made on a solid silicon substrate.
Figure 2:
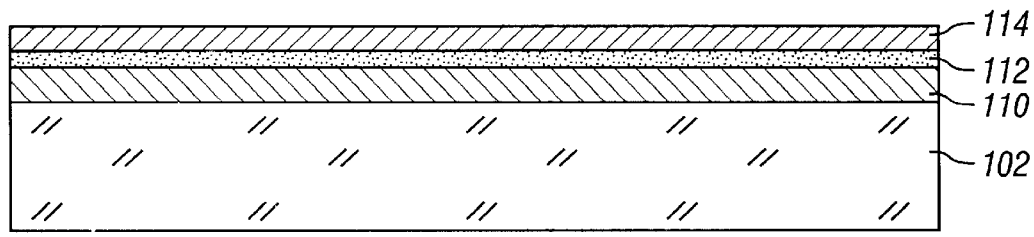
FIGS. 2 to 8 are simplified diagrammatic sections illustrating successive steps in manufacturing an integrated circuit according to the invention.

FIG. 2 shows an N type substrate 100 in which a first strongly N+ doped conducting layer 110 has been formed. For example, this layer 110 may be formed by implantation of arsenic at a dose of $3.10^{15}/cm^{-2}$, followed by annealing at 950° C. for 1 hour.

A first layer of oxide 112 and a second conducting layer 114 are each formed in sequence on the first conducting layer 110. For example, the oxide layer 112 may be grown to a thickness of 15 nm.

The second conducting layer 114 is a layer of N+ doped polycrystalline silicon and, for example, may be deposited to a thickness of the order of 600 nm. (The layer thicknesses are not shown to scale in the figure).

The first oxide layer 112 and the second conducting layer 114 are etched stopping on the first silicon conducting layer 110 based on a pattern to preserve part of the second conducting layer 114 and the subjacent oxide layer 112.

Figure 3:
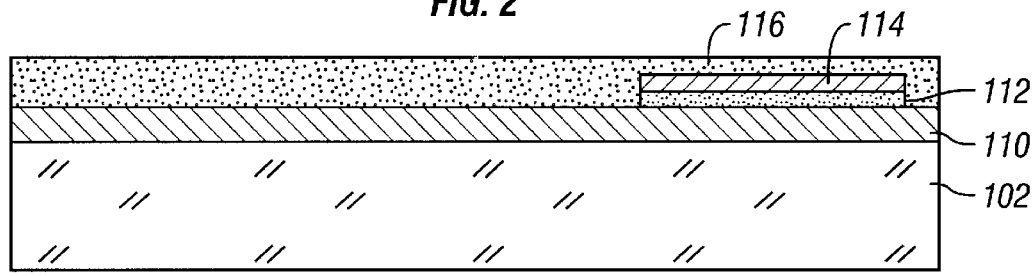

As shown in FIG. 3, a second oxide layer 116 is deposited on the substrate so as to encapsulate part of the second conducting layer 114 preserved during etching. For example, the thickness of the second oxide layer may be 1.5 µm.

This layer is made plane by mechanochemical polishing, in which an oxide layer, preferably of the order of 0.2 µm thick, is kept above the polycrystalline silicon in the second conducting layer 114.

Figure 4:
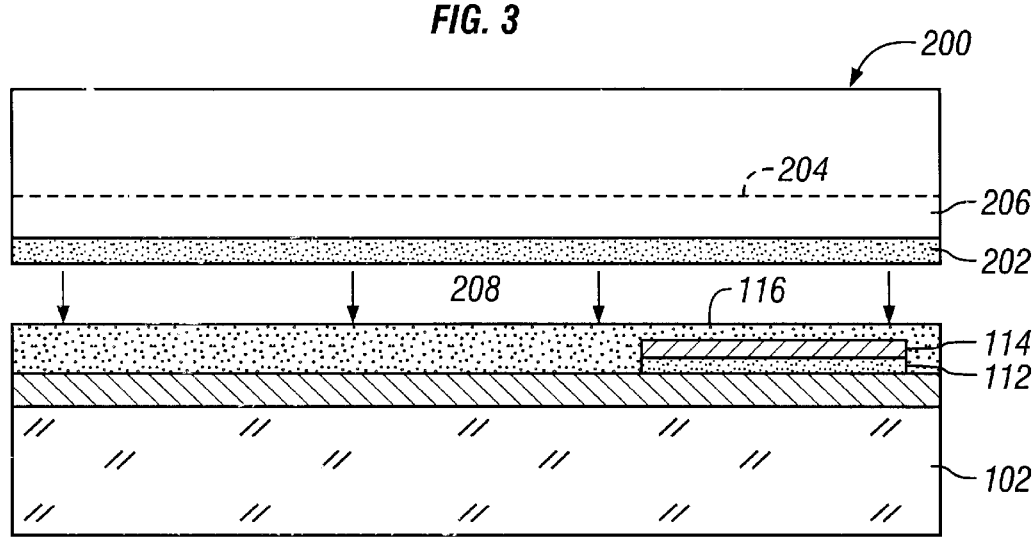
Figure 5:
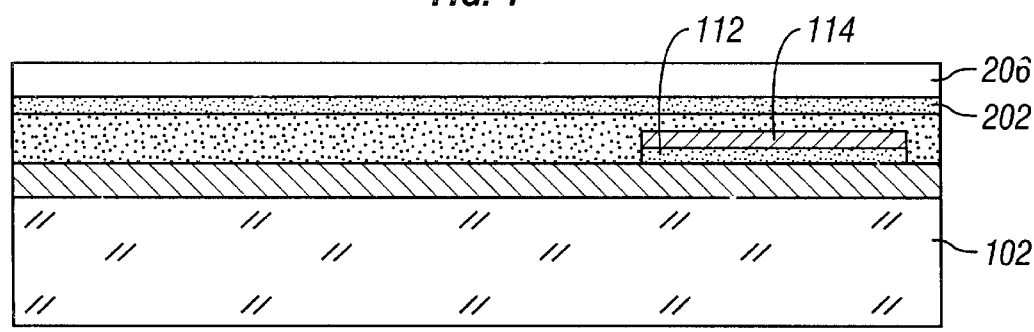

A subsequent step illustrated in FIGS. 4 and 5 consists of transferring an SOI structure comprising an oxide layer 202 and a thin silicon surface layer 206, onto the second oxide layer 116. These layers are transferred from a second substrate 200.

The second substrate 200 is a silicon wafer, and the surface layer of silicon oxide 202 is formed on the surface of this wafer. An embrittlement area 204, for example defined by implantation of rare gas or nitrogen ions in substrate 200, initially delimits the thin layer of silicon 206 in the substrate in contact with the surface layer of silicon oxide. The embrittlement area 204 extends approximately parallel to the surface of the second substrate.

As shown by the arrows 208, the second substrate 200 is transferred onto the first substrate 100 by rotating the surface layer of oxide 202 towards the surface of the first silicon substrate in which implantation was done. This surface is denoted the upper surface.

The oxide layer 202 is bonded to the upper surface of the first substrate, for example by atomic bonding forces.

An appropriate heat treatment then allows to cleave the second substrate 200 along the embrittlement area 204 and to separate the thin layer 206 from the second substrate.

Figure 6:
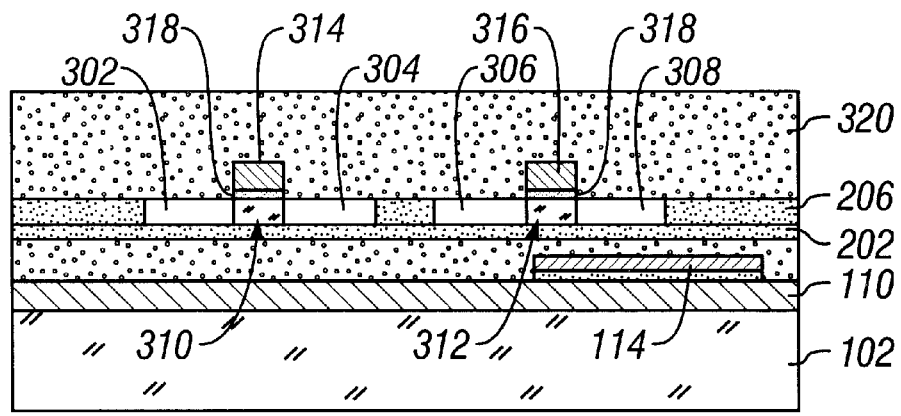

The active areas 302, 304, 306, 308 of transistors 310, 312 are then formed in the thin layer 206. The remaining parts of the thin layer are oxidized and grids of transistors 314, 316 are formed on the thin layer. A thick insulating layer such as an oxide layer 320 is formed above the thin layer in order to surround the transistor grids. The structure shown in FIG. 6 is obtained.

Areas 302, 304 are N+ doped and form the source and drain of a first NMOS transistor 310. Areas 306 and 308 are P+ doped and form the source and drain of a second PMOS transistor 312. References 314 and 316 denote the grids of transistors 306 and 308 respectively, formed on the thin surface layer through a grid oxide layer 318.

The parts of the thin surface layer 206 located between transistors 310 and .312 are oxidized to mutually isolate these components.

Finally, as indicated above, a thick insulating layer 320 is formed on the substrate surface to entirely cover the grids.

It can be observed that the mutual layout of the transistors, in other words the active areas, and the first and second substrate conducting layers, is such that the active areas partially overlap the first and second conducting layers 110, 114.

Figure 7:
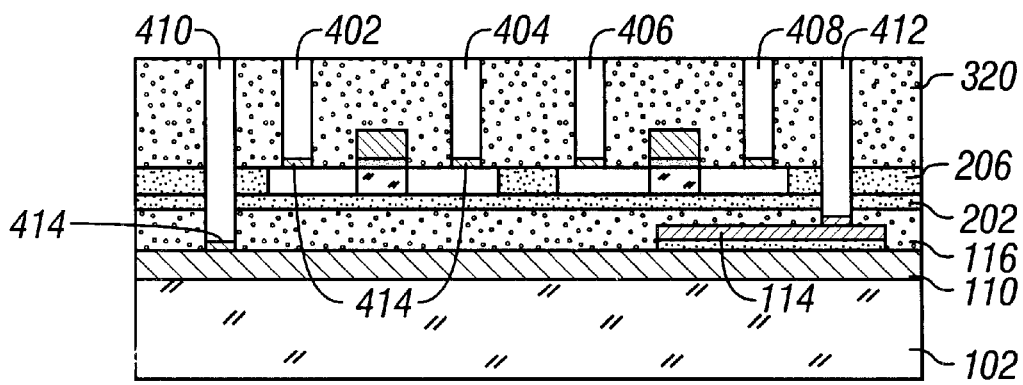

FIG. 7 illustrates a subsequent step during which openings 402, 404, 406, 408 are formed in a thick oxide layer to reach active areas 302, 304, 306, 308 respectively.

These openings are formed by reactive ionic etching stopping on the silicon in active areas. For example, their diameter may be 0.5 µm.

Openings 410 and 412 are also formed through the thick oxide layer through the oxidized silicon layer outside the active areas, through the oxide layer 202 transferred onto the substrate, and through the second oxide layer 116 to reach the first and second conducting layers 110, 114 respectively. The diameter of these openings may be larger, for example 0.8 µm All opening operations (from 402 to 412) may be done simultaneously.

Openings 410, 412 reaching the conducting layers do not occupy an excessive amount of space on the surface of the chip, to the extent that there are usually significantly fewer of these openings than the openings formed vertically in line with active areas.

Furthermore, it is found that all openings are formed through electrically insulating materials.

After chemical cleaning of the bottom of the openings and the possible formation of a diffusion barrier layer 414, for example made of Ti/TiN, the openings are filled with a conducting material such as tungsten deposited by CVD to form vias.

Figure 8:
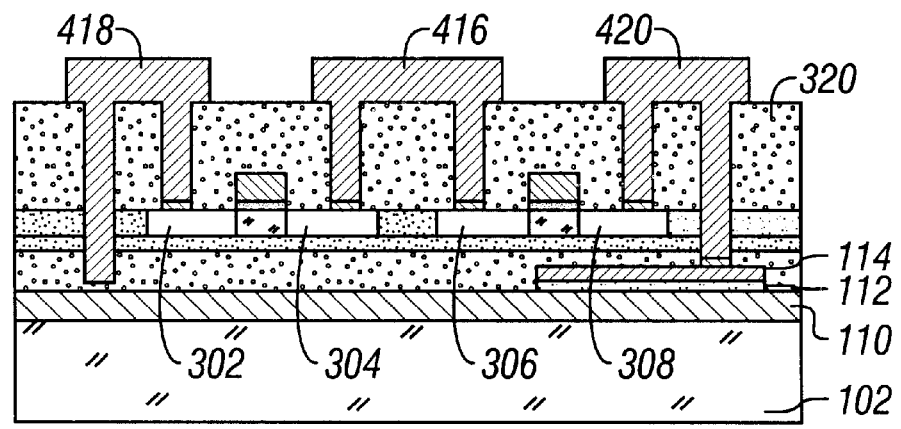

Then as shown in FIG. 8, conducting-tracks are formed on the surface of the thick insulating layer 320. These conducting tracks 416, 418 and 420 are in contact with the vias. They are formed by deposition then etching a layer of conducting material according to a mask.

For example, track 418 is connected to the source 302 of the first transistor 310 and to the first conducting layer 110. It forms one of the power supply terminals (actually the ground terminal) with the first conducting layer 110.

The track 420 that forms a second power supply terminal is connected to the source 308 of the second transistor 312 and to the remaining part of the second conducting layer 114 in the substrate.

The first and second conducting layers 110, 114 separated by the first oxide layer 112, form the foils of a decoupling capacitor decoupling the power supply terminals.

Furthermore, the first conducting layer 110 on the substrate may be used as a power supply track, for example as a common ground track. This is the case in the example in FIG. 8 in which an active area 302 is connected to the first conducting layer 110 through vias and a conducting track 418. A larger space may then be set aside on the surface of the thick oxide 320 to make interconnections between components. Similarly, the second conducting layer 114 may be used as a power supply track.

The above description applies to example circuits made with a small number of components and with only two power supply terminals. However, the invention is also applicable to circuits with a very large number of components and active areas powered by several separate power supply sources. The number of power supply terminals, and possibly the number of decoupling capacitors, is thus increased.

It is also found that, since capacitors and active areas are made quite separately, the manufacturing parameters for each of these two elements can be optimized separately. This is another advantage over circuits made on a solid substrate according to prior art.

REFERENCE DOCUMENTS (1)
Proceedings 1995 IEEE International SOI Conference, October 1995, pages 100–101.
"On-chip decoupling capacitor designed to reduce switching-noise-induced instability in CMOS/SOI VLSI" L. K. Wang and Howard H. chen.

(2)
Proceedings 1996 IEEE International SOI Conference, October 1996, pages 112–113.
"Simultaneous Switching noise projection for High-Performance SOI chip design" L. K. Wang and Howard H. chen.

(3)
1998 IEEE International Solid-State Circuits Conference, pages 230–231 J. Silberman et al.

(4)
U.S. Pat. No. 5 378 919

What is claimed is:

1. Process for making an integrated circuit equipped with capacitive means of decoupling electrical power supply terminals comprising the following steps in sequence:

a) formation of a first insulating layer (112) and a second conducting layer (114) in order, starting from the surface, on a substrate (100) comprising a first conducting layer (110), b) formation of the second conducting layer (114) to leave at least part of the second conducting layer separated from the first conducting layer by the insulating layer, c) formation of a second insulating layer (116) surrounding part of the second conducting layer, d) creation of a thin layer (206) of semiconducting material on the second insulating layer (116), e) formation of at least one component in the thin layer, comprising at least one active area (302, 304, 306, 308) and oxidation of the thin layer between the components, f) formation of a thick electrical insulating layer (320) on the thin layer, g) formation of openings passing through the thick insulating layer, the thin layer (206), and the layer of electrical insulating material (116) outside components to reach the first and second conducting layers, h) placement of the conducting material in the openings, and formation of electrical interconnections to connect the first and second conducting layers to first and second electrical power supply terminals, respectively.

2. Process according to claim 1, in which step g) also comprises the formation of openings passing through the thick insulating layer to reach active areas in the thin layer, these openings also being filled in step h) with conducting material to selectively connect active areas to each other or to connect active areas to electrical power supply terminals.

3. Process according to claim 1, in which step d) comprises transferring a silicon wafer (200) with a surface layer of silicon oxide (202) onto the substrate, the silicon oxide layer being separated from the second insulating layer and the silicon wafer being cleaved to leave the thin layer (206) of semiconducting material on the substrate surface.

4. Process according to claim 1, in which the second insulating layer (116) is polished after step c).

* * * * *